United States Patent
Seok

(10) Patent No.: US 9,106,139 B2
(45) Date of Patent: *Aug. 11, 2015

(54) LOW FORWARD VOLTAGE RECTIFIER

(71) Applicant: IXYS Corporation, Milpitas, CA (US)

(72) Inventor: Kyoung Wook Seok, Milpitas, CA (US)

(73) Assignee: IXYS Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/149,746

(22) Filed: Jan. 7, 2014

(65) Prior Publication Data

US 2014/0119064 A1    May 1, 2014

Related U.S. Application Data

(63) Continuation of application No. 13/317,800, filed on Oct. 29, 2011, now Pat. No. 8,649,199.

(51) Int. Cl.
| | |
|---|---|
| *H02M 1/00* | (2007.01) |
| *H02M 3/335* | (2006.01) |
| *H01L 23/495* | (2006.01) |
| *H01L 23/31* | (2006.01) |
| *H01L 23/00* | (2006.01) |

(52) U.S. Cl.
CPC ......... *H02M 3/335* (2013.01); *H01L 23/49562* (2013.01); *H02M 3/33576* (2013.01); *H01L 23/3107* (2013.01); *H01L 24/32* (2013.01); *H01L 24/48* (2013.01); *H01L 2224/32245* (2013.01); *H01L 2224/48195* (2013.01); *H01L 2224/48472* (2013.01); *H01L 2224/4903* (2013.01); *H01L 2224/73265* (2013.01); *H01L 2924/12032* (2013.01); *H01L 2924/1305* (2013.01); *H01L 2924/19107* (2013.01); *H02M 2001/0048* (2013.01); *Y02B 70/1491* (2013.01); *Y10T 29/4913* (2015.01)

(58) Field of Classification Search
CPC .................. H02M 3/33507; H02M 3/33523; H02M 3/33592; H02M 7/003
USPC ................. 363/21.12, 21.13, 21.14, 127, 147
See application file for complete search history.

(56) References Cited

U.S. PATENT DOCUMENTS

| | | | |
|---|---|---|---|
| 3,582,758 A | 6/1971 | Gunn | 363/127 |
| 4,247,859 A | 1/1981 | Rai-Choudhury | 257/352 |
| 6,107,860 A | 8/2000 | Vinciarelli | 327/427 |
| 6,430,071 B1 | 8/2002 | Haneda | 363/127 |
| 6,678,180 B2 | 1/2004 | Matsuda | 363/132 |
| 8,648,399 B2 * | 2/2014 | Seok | 257/277 |
| 8,649,199 B2 * | 2/2014 | Seok | 363/147 |

(Continued)

*Primary Examiner* — Adolf Berhane
(74) *Attorney, Agent, or Firm* — Imperium Patent Works; T. Lester Wallace

(57) ABSTRACT

A Low Forward Voltage Rectifier (LFVR) includes a bipolar transistor, a parallel diode, and a base current injection circuit disposed in an easy-to-employ two-terminal package. In one example, the transistor is a Reverse Bipolar Junction Transistor (RBJT), the diode is a distributed diode, and the base current injection circuit is a current transformer. Under forward bias conditions (when the voltage from the first package terminal to the second package terminal is positive), the LFVR conducts current at a rated current level with a low forward voltage drop (for example, approximately 0.1 volts). In reverse bias conditions, the LFVR blocks current flow. Using the LFVR in place of a conventional silicon diode rectifier in the secondary of a flyback converter reduces average power dissipation and increases power supply efficiency.

13 Claims, 11 Drawing Sheets

LOW FORWARD VOLTAGE RECTIFIER

(56) References Cited

U.S. PATENT DOCUMENTS 8,737,094 B2 * 5/2014 Seok et al. ................. 363/21.14
2009/0316441 A1 12/2009 Hu .............................. 363/21.06
2012/0063175 A1 3/2012 Wang ......................... 363/21.14
2013/0127017 A1 5/2013 Seok ............................. 257/577

* cited by examiner

FLYBACK CONVERTER

FLYBACK CONVERTER

SILICON DIODE

SCHOTTKY DIODE

BJT (IF $I_B = 0.1 * I_{RATED}$)

| | $V_T$ | $V_F$ |
|---|---|---|
| SILICON DIODE | 0.7 | 1.0 |
| SCHOTTKY DIODE | 0.4 | 0.7 |
| BJT (IF $I_B = 0.1*I_{RATED}$) | 0.1 | 1.0 |
| RBJT (IF $I_B = 0.3*I_{RATED}$) | 0.7 | 0.1 |

DIODE CONTACT 96

77

THE PARALLEL DIODE IS IMPLEMENTED IN DISTRIBUTED FORM ACROSS THE INTEGRATED CIRCUIT

BASE CONTACT 79

SIMPLIFIED TOP DOWN VIEW OF INTEGRATED CIRCUIT

CROSS-SECTIONAL SIDE VIEW OF INTEGRATED CIRCUIT TAKEN ALONG LINE A-A

FLYBACK CONVERTER

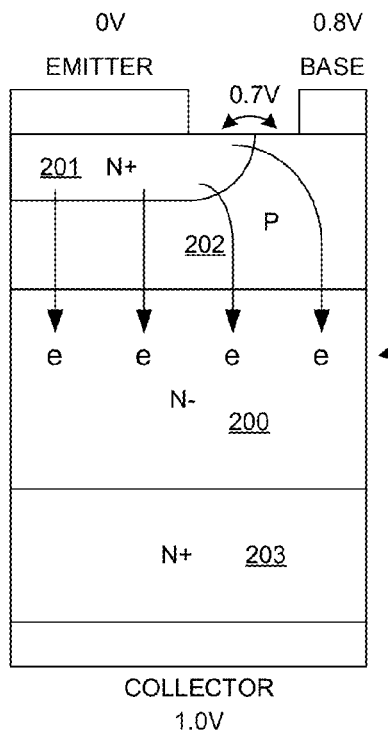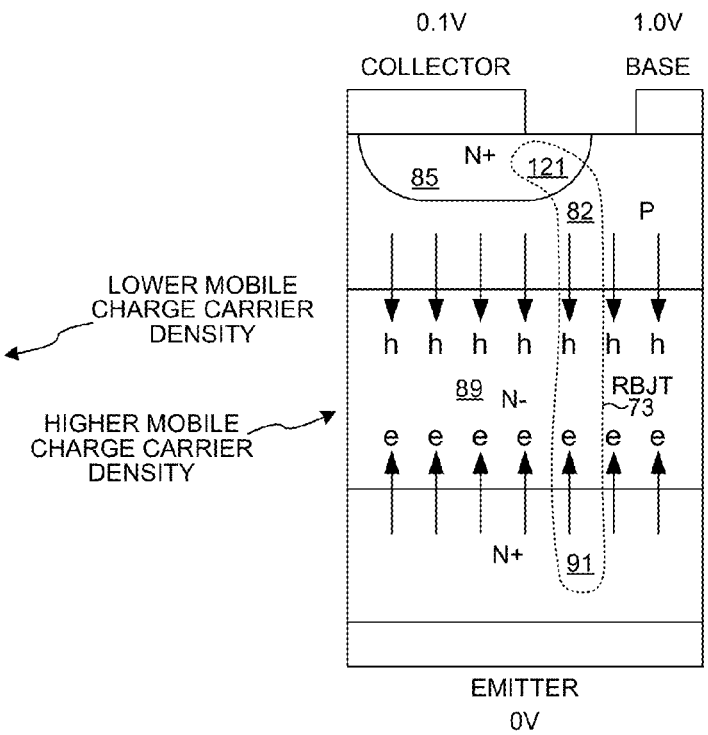
CONVENTIONAL BJT
(AT $I_{RATED}$)
FIG. 19
RBJT
(AT $I_{RATED}$)
FIG. 20

CONVENTIONAL DIODE

RBJT

| | AVE. POWER DISSIPATION (WATTS) |
|---|---|
| PRIOR ART DIODE (FIG. 1) | ~15W |
| LOW FORWARD VOLTAGE RECTIFIER (FIG. 14) | ~6W |

POWER DISSIPATION IN THE RECTIFYING
ELEMENT OF THE SECONDARY OF A
FLYBACK CONVETER

LOW FORWARD VOLTAGE RECTIFIER

TRANSFORMER
CONCEPTUAL DIAGRAM

TRANSFORMER (PERSPECTIVE VIEW)

LOW FORWARD VOLTAGE RECTIFIER

LOW FORWARD VOLTAGE RECTIFIER

LOW FORWARD VOLTAGE RECTIFIER

CROSS-REFERENCE TO RELATED APPLICATION

This application is a continuation of, and claims the benefit under 35 U.S.C. §120 from, nonprovisional U.S. patent application Ser. No. 13/317,800, entitled "Low Forward Voltage Rectifier," filed on Oct. 29, 2011. This application expressly incorporates by reference the entire content of U.S. patent application Ser. No. 13/317,800.

TECHNICAL FIELD

The described embodiments relate to rectifiers, and more particularly to rectifiers for flyback power supplies.

BACKGROUND INFORMATION

FIG. 1 (Prior Art) is a simplified circuit diagram of a flyback converter power supply 1. Flyback converter 1 generates a 5.0 volt DC voltage from a 110 volt AC source. 110 volts AC supplied from source 2 is present between connectors 3 and 4. The 110 volt AC voltage is rectified by a full wave bridge rectifier comprising diodes 5-8. Capacitor 9 is a smoothing capacitor. A rough DC voltage $V_{IN}$ of approximately the 150 volt peak voltage of the 110 volt AC RMS input signal is present on conductor and node 10. A switch 11 is rapidly switched on and off to pull pulses of current through the primary winding 12 of a transformer 13 from this $V_{IN}$ conductor. When a pulse of current is pulled through the primary winding 12, an amount of energy is stored in the transformer 13. When the switch 11 is then opened, a pulse of current is made to flow from the secondary winding 14 so that energy stored in the transformer 13 is transferred to the load 15. The current from the secondary winding 14 flows through a rectifier diode 16. Such pulses of current keep charge on a storage capacitor 17 so that the desired 5.0 volts DC is maintained across load 15 between $V_{OUT}$ conductor 18 and ground conductor 19. Standard sensing and control circuitry that controls the switching of switch 11 is not illustrated in order to simplify the diagram. The flyback topology of FIG. 1, including its sensing and control circuitry, is well known in the art.

FIG. 2 (Prior Art) is a set of simplified waveform diagrams. These diagrams set forth waveforms of voltages and currents present in the circuit of FIG. 1. The upper waveform labeled $V_S$ shows the voltage present across switch 11. From time $t_0$ to time $t_1$, switch 11 is closed. Current is flowing from node 10, through the primary winding 12, and through switch 11, and to ground node and conductor 20. From time $t_0$ to time $t_0$ this current increases as illustrated in the waveform labeled $I_S$. From time $t_0$ to time $t_1$, energy is being stored in the transformer. Switch 11 is closed. Accordingly, the voltage across switch 11 is zero. Magnetic flux is building in the transformer as indicated by the waveform labeled "MAGNETIC FLUX". Then at time $t_1$, switch 11 is opened. The opening of switch 11 causes a current to stop flowing in the primary winding 12, and to start flowing in the secondary winding 14. As illustrated in the fourth waveform labeled $I_D$, this current flowing in the secondary winding 14 decreases over time. The magnetic flux in the transformer decreases as well. At time $t_2$, there is no more energy stored in the transformer and the secondary current stops flowing. From time $t_2$ to time $t_3$, there is little or no current flow in either the primary winding 12 or the secondary winding 14 of the transformer as indicated by the $I_S$ and $I_D$ waveforms. The switching cycle repeats at time $t_0$ when switch 11 is closed again to start the next cycle. The switching period from time $t_0$ of one period to time $t_0$ of the next period may, for example, be ten microseconds.

FIG. 3 (Prior Art) illustrates current flow from time $t_2$ to time $t_0$. Reference numeral 21 identifies the split core of transformer 13. FIG. 4 (Prior Art) illustrates current flow from time $t_0$ to time $t_1$. FIG. 5 (Prior Art) illustrates current flow from time $t_1$ to time $t_2$.

When current is flowing from the secondary winding 14 of the transformer 13 and to capacitor 17 and load 15, the current is flowing through rectifier diode 16. The rectifier diode 16 being in the current path results in unwanted power dissipation. At a given time, the instantaneous power dissipated in rectifier diode 16 is the product of the instantaneous current flow through the diode and the instantaneous voltage being dropped across the diode. Average power dissipation in rectifier diode 16 is the average of such instantaneous power dissipation taken over the entire switching cycle of the flyback converter. In a common conventional flyback converter that outputs 20 amperes at 5.0 volts DC such as the flyback converter illustrated in FIG. 1, the forward voltage drop $V_F$ of the rectifying diode at its rated current flow is approximately 1.0 volts. Average power dissipation in the rectifying diode may be approximately 15 Watts.

SUMMARY

A Low Forward Voltage Rectifier (LFVR) in an easy-to-employ two-terminal TO-247 package comprises a first package terminal, a second package terminal, a bipolar transistor, a parallel diode, and a base current injection circuit. The collector of the bipolar transistor is coupled to the first package terminal. The emitter of the bipolar transistor is coupled to the second package terminal. The parallel diode is coupled between the collector and the emitter of the bipolar transistor so that the anode of the diode is coupled to the collector and the cathode of the diode is coupled to the emitter. The base current injection circuit injects a base current into the bipolar transistor in forward bias conditions (conditions in which the voltage on the first package terminal is greater than the voltage on the second package terminal) such that the voltage drop from the first package terminal to the second package terminal is substantially less than 0.7 volts when a current greater than a predetermined current is flowing from the first package terminal to the second package terminal. The forward voltage drop from the first to second package terminals may be approximately 0.1 volts.

In one example, if current flow from the first package terminal to the second package terminal is less than the predetermined current under forward bias conditions, then the voltage drop from the first package terminal to the second package terminal is limited by the diode to be approximately 0.8 volts. In reverse bias conditions (conditions in which the voltage between the first package terminal and the second package terminal is negative), the LFVR blocks current flow.

In one example, the base current injection circuit involves a current transformer. The current transformer has a first winding and a second winding wrapped around a ring-shaped ferrite core. The current transformer, the bipolar transistor, and the parallel diode are interconnected such that the second winding is in the current path of the collector current of the bipolar transistor. The first winding is coupled to supply a base current to the base of the bipolar transistor. In one specific case, the base current $I_B$ supplied by the first winding of the current transformer to the base is approximately one third of the collector current $I_C$ flowing through the second winding of the transformer. For collector currents greater than the predetermined critical collector current $I_{C-CRIT}$, the base current supplied to the bipolar transistor is adequate to keep the transistor in saturation such that $V_{CE}$ is substantially less than 0.7 volts (approximately 0.1 volts).

In one example, the bipolar transistor is a Reverse Bipolar Junction Transistor (RBJT) and the parallel diode is a distributed diode. Both the RBJT and the distributed diode are parts of a novel integrated circuit. The reverse breakdown voltage from the emitter of the RBJT to the base of the RBJT is greater than 20 volts. The reverse breakdown voltage from the emitter of the RBJT to the collector of the RBJT is greater than 20 volts. Using the Low Forward Voltage Rectifier for the rectifying component in a flyback converter power supply reduces average power dissipation as compared to using a conventional silicon diode for the rectifying component. Reducing average power dissipation increases power supply efficiency. The easy-to-employ two-terminal TO-247 package of the LFVR allows a conventional diode in the secondary of a flyback converter to be removed and replaced with the LFVR with a minimal amount of PCB layout and power supply design changes.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 19 is a simplified cross-sectional diagram of a conventional bipolar junction transistor (BJT) structure.

FIG. 20 is a simplified cross-sectional diagram of the RBJT of FIG. 14.

DETAILED DESCRIPTION

Reference will now be made in detail to background examples and some embodiments of the invention, examples of which are illustrated in the accompanying drawings.

Figure 6:
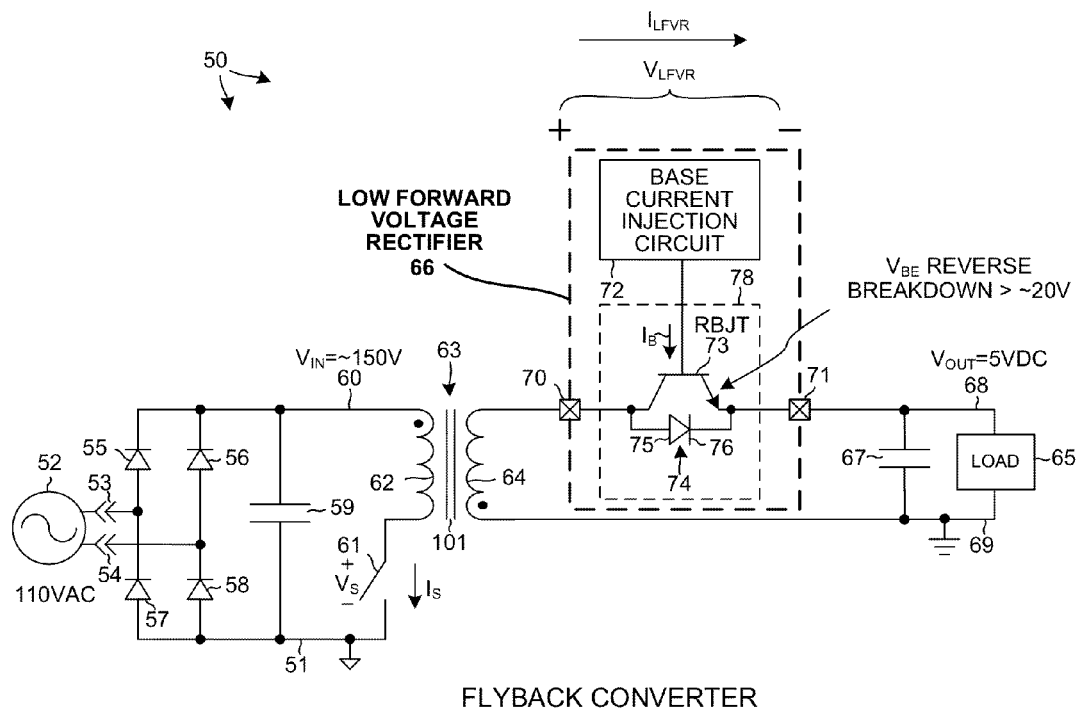
FIG. 6 is a flyback converter that includes a Low Forward Voltage Rectifier (LFVR) in accordance with one novel aspect.

FIG. 6 is a simplified circuit diagram of a flyback converter 50 in accordance with one novel aspect. Flyback converter 50 generates a 5.0 volt DC (direct current) voltage from a 110 volt AC (alternative current) source (110 VAC RMS). 110 volts AC RMS supplied from source 52 is present between connectors 53 and 54. The 110 volt AC voltage is rectified by a full wave bridge rectifier comprising diodes 55-58. Capacitor 59 is a smoothing capacitor. A somewhat rough DC voltage $V_{IN}$ is present on conductor and node 60. The magnitude of $V_{IN}$ is approximately the peak voltage of the 110 VAC RMS signal, which is 150 volts. A switch 61 is rapidly switched on and off to pull pulses of current through the primary winding 62 of a transformer 63. When one such pulse of current is pulled from node 60, through the primary winding 62, through switch 61, and to ground node and conductor 51, an amount of energy is stored in the transformer. When switch 61 is then opened current stops flowing in the primary winding 62, but a pulse of current is then made to flow from the secondary winding 64 so that energy previously stored in the transformer is then transferred to the load 65. The current from the secondary winding 64 flows through a novel Low Forward Voltage Rectifier 66 (LFVR). Such pulses of secondary current keep a storage capacitor 67 charged so that the desired 5.0 volts DC is maintained across load 65 between $V_{OUT}$ conductor 68 and ground conductor 69. Sensing and control circuitry that controls the switching of switch 61 is not illustrated in order to simply the diagram. Many suitable sensing and control circuits for controlling switch 61 are known in the art.

In the illustrated example, LFVR 66 comprises a first package terminal 70, a second package terminal 71, a base current injection circuit 72, a Reverse Bipolar Junction Transistor (RBJT) 73, and a parallel diode 74, interconnected as illustrated in FIG. 6. The anode 75 of the diode 74 is coupled to the collector of RBJT 73. The cathode 76 of the diode 74 is coupled to the emitter of RBJT 73. The voltage from the first package terminal 70 to the second package terminal 71 is denoted $V_{LFVR}$. The current flow from the first package terminal 70 to the second package terminal 71 is denoted $I_{LFVR}$. The base current injection circuit 72 functions to inject an adequate base current $I_B$ into RBJT 73 so that when current $I_{LFVR}$ is flowing the voltage drop (from terminal 70 to terminal 71) is substantially lower than 0.7 volts (for example, about 0.1 volts) throughout as much of the time from time $t_1$ to time $t_2$ as possible.

Figure 7:
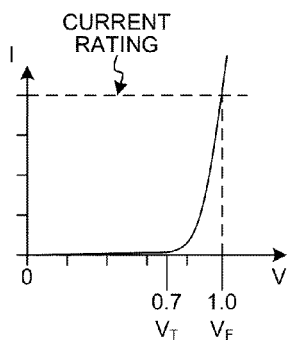
FIG. 7 is a diagram of the IV characteristic of a silicon diode.

FIG. 7 is a diagram showing the IV curve for an ordinary silicon diode where the junction is a semiconductor-semiconductor junction. The diode starts to conduct current when a positive voltage of approximately 0.7 volts (denoted $V_T$) is present from its anode to its cathode. When a positive voltage is present across the diode from its anode to its cathode, and the diode is conducting at its rated current, then the forward voltage drop across the diode is about 1.0 volts. This voltage drop is denoted VB. When the diode is reverse biased (a negative voltage is present from its anode to its cathode), then the diode effectively blocks current flow for negative voltages that are not too high. This is the type of diode commonly used for the rectifier diode in a conventional flyback converter.

Figure 8:
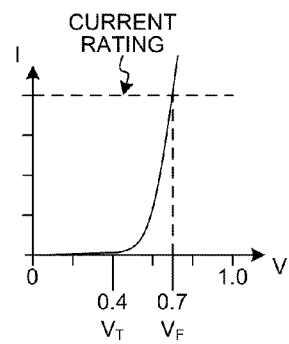
FIG. 8 is a diagram of the IV characteristic of a Schottky diode.

FIG. 8 is a diagram showing the IV curve for another type of diode referred to as a Schottky diode where the junction is a metal-semiconductor junction. As shown, the Schottky diode begins to conduct current at a lower positive voltage $V_T$ of 0.4 volts between its anode and its cathode. The Schottky diode has a lower forward voltage $V_F$ of 0.7 volts at the rated current of the diode.

Figure 9:
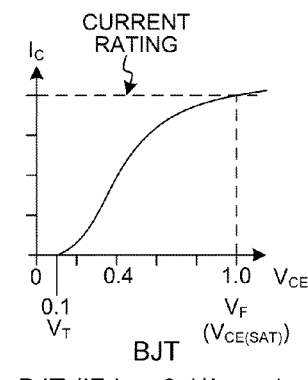
FIG. 9 is a diagram of the $V_{CE}$ to $I_C$ characteristic of a conventional BJT, provided that an adequately large base current is supplied to the BJT.

FIG. 9 is a diagram showing the collector-to-emitter voltage $V_{CE}$ drop across an ordinary bipolar transistor as a function of collector current $I_C$. The curve of FIG. 9 assumes that the base current $I_B$ is adequately large to keep the transistor in saturation. In the example, the base current $I_B$ is one tenth of the rated collector current. Note that the voltage drop $V_{CE}$ is about 1.0 volts at the rated collector current.

If the silicon diode of FIG. 7 were used as the rectifier component in the secondary of a flyback converter, then there would be a 1.0 voltage drop across the diode when a pulse of secondary current is flowing through the diode at the diode rated current. This voltage drop would correspond to a high power dissipation. Similarly, if the Schottky diode of FIG. 8 were used as the rectifier component in the secondary of a flyback converter, then there would be a 0.7 voltage drop across the diode when a pulse of secondary current is flowing through the diode at the diode rated current. This voltage drop would correspond to an undesirably high power dissipation as well. Similarly, if the ordinary bipolar transistor of FIG. 9 were used as the rectifier component in the secondary of a flyback converter, then there would be a $1.0 V_{CE}$ voltage drop across the transistor when the pulse of secondary current is flowing through the transistor at the rated current. This 1.0 volt $V_{CE}$ voltage drop would correspond to a high power dissipation.

Figures 10, 11:
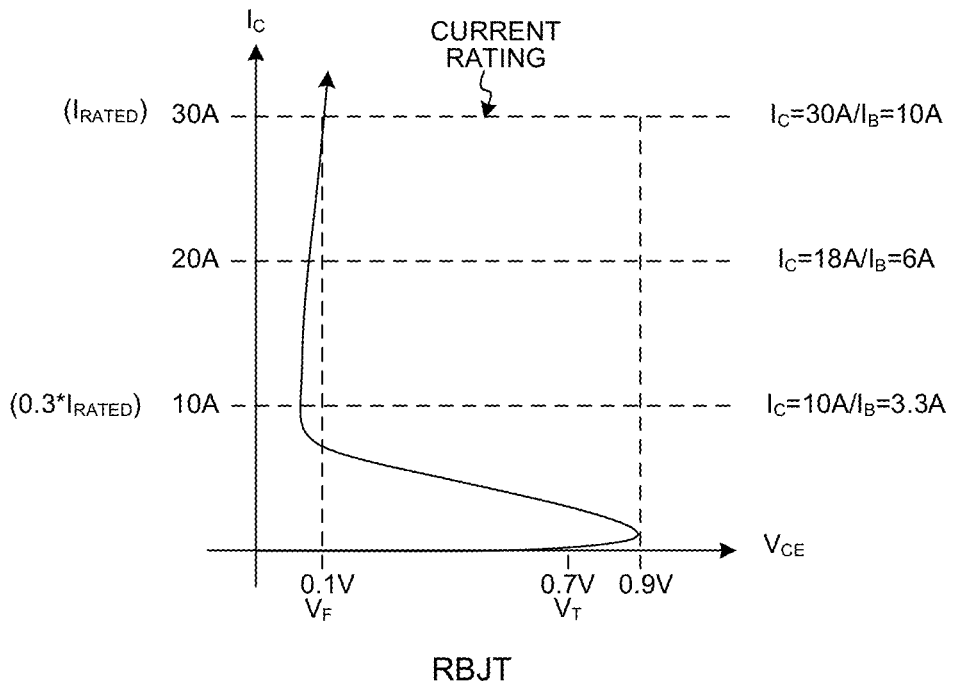
FIG. 10 is a diagram of the $V_{CE}$ to $I_C$ characteristic of a Reverse Bipolar Junction Transistor (RBJT), provided that an adequately large base current is supplied to the RBJT.
FIG. 11 is a table that sets forth $V_F$ and $V_T$ for various different types of rectifying components.

FIG. 10 is a diagram showing the collector-to-emitter voltage $V_{CE}$ drop across RBJT 73 of the Low Forward Voltage Rectifier (LFVR) 66 of FIG. 6, where the base current $I_B$ is maintained at one third of the collector current $I_C$. RBJT 73 starts conducting collector current $I_C$ at a collector-to-emitter voltage $V_{CE}$ of about 0.7 volts. As the collector current increases, the $V_{CE}$ across RBJT 73 increases up to about 0.9 volts for very low collector currents. As the collector current increases further, however, the $V_{CE}$ across the transistor decreases rapidly. For a collector current equal to one third of the rated collector current $I_{RATED}$, the $V_{CE}$ is less than 0.1 volts. Further increases in collector current $I_C$ up to the RBJT rated collector current $I_{RATED}$ only slightly increases the $V_{CE}$ across the RBJT. For a collector current equal to the rated collector current $I_{RATED}$, the $V_{CE}$ is approximately 0.1 volts (denotes forward voltage $V_F$) as illustrated. In the illustrated example, $I_{RATED}$ is 30 amperes.

FIG. 11 is a table that sets forth the forward bias voltages $V_T$ where the various rectifiers begin to conduct forward current. FIG. 11 also shows the voltage drops $V_F$ across the various rectifiers when the rectifiers are conducting at their rated currents.

Figure 12:
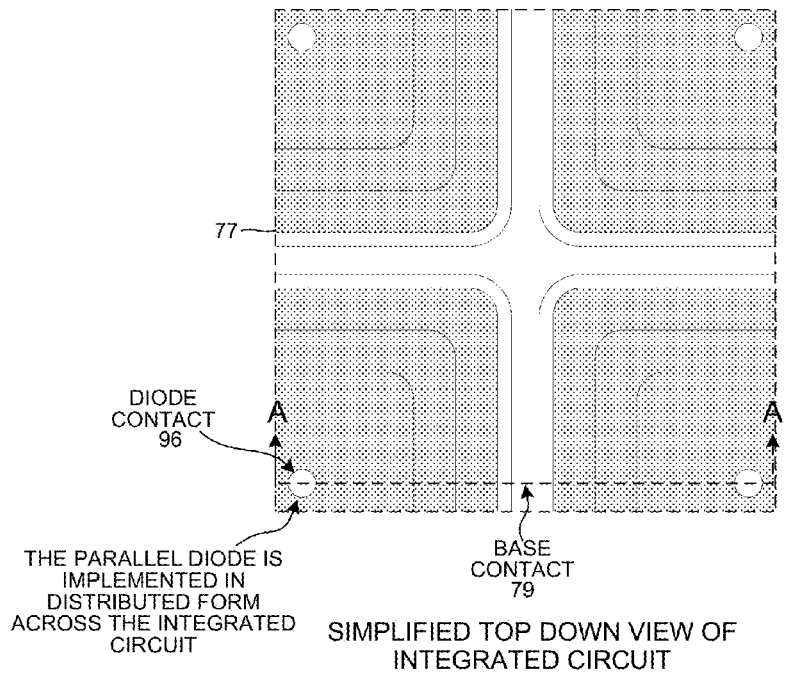
FIG. 12 is a top-down schematic diagram of a square portion of an integrated circuit in accordance with one novel aspect. The integrated circuit includes both the RBJT and the distributed parallel diode in integrated form.

FIG. 12 is a simplified top down diagram of a square portion 77 of RBJT 73 and parallel diode 74. RBJT 73 and parallel diode 74 are integrated to be parts of the same integrated circuit 78. The square portion 77 illustrated in FIG. 12 is replicated many times in rows of adjacent squares and columns of adjacent squares across the integrated circuit 78. From a top-down perspective, the base contact 79 has a two-dimensional grid pattern of horizontally extending strips of the base contact and vertically extending strips of the base contact. Within each of the squares formed by this two-dimensional grid is a square N-type collector region. Integrated circuit 78 involves approximately one hundred copies of the square illustrated in FIG. 12.

Figure 13:
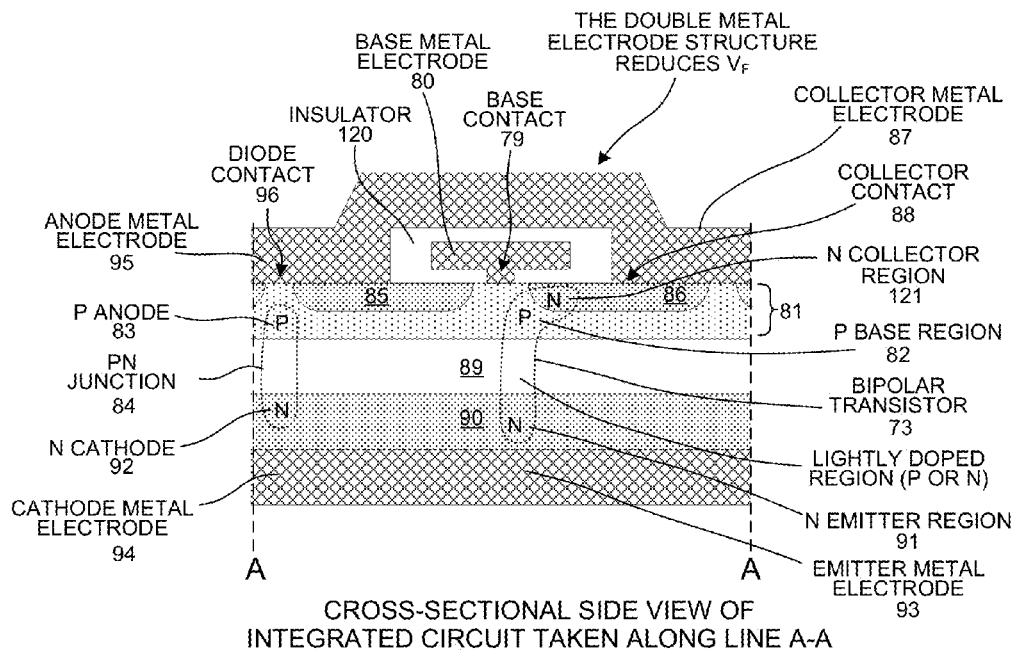
FIG. 13 is a cross-sectional side view taken along sectional line A-A of the square portion of FIG. 12.

FIG. 13 is a cross-sectional side view taken along sectional line A-A in FIG. 12. A base metal electrode 80 makes electrical contact with P-type layer 81 at base contact 79. A part 82 of the P-type layer 81 serves as the P-type base region of RBJT 73, and another part 83 of the P-type layer serves as the P-type anode of a PN junction 84. In a case where lightly doped region 89 is P-type the actual PN junction of the diode will be the interface between regions 89 and 90, whereas in a case where lightly doped region 89 is N-type the actual PN junction of the diode will be the interface between regions 81 and 89. N-type collector regions 85 and 86 extend down into the P-type layer 81 from the upper surface of the semiconductor material. A collector metal electrode 87 makes contact with these N-type collector regions at a collector contact 88. The collector metal electrode 87 also serves as an anode metal electrode 95 and makes contact with the P-type anode 83 of PN junction 84 at a diode contact 96. The collector metal electrode 87 bridges over the base metal electrode 80 as illustrated. An amount of insulative material 120 prevents the collector metal electrode 87 from making electrical contact with the underlying base metal electrode 80. This double metal electrode structure involving a collector metal electrode that bridges over a base metal electrode allows the RBJT to have a lower forward voltage $V_F$ as compared to a single metal layer structure involving interdigitated base and collector electrodes.

A lightly doped layer 89 is disposed under the P-type layer 81. An N-type layer 90 is disposed under the lightly doped layer 89. A part 91 of the N-type layer 90 serves as the emitter region of RBJT 73, whereas another part 92 of the N-type layer 90 serves as the N-type cathode 92 of PN junction 84. The entire bottom surface of the semiconductor material is covered with a layer of metal that serves as an emitter metal electrode 93 and as a cathode metal electrode 94. The simplified illustration of RBJT 73 involves N-type collector region 121, P-type base region 82, an amount of the lightly doped region, and N-type emitter region 91.

Note that each diode contact (a contact from metal electrode 87 and 95 down to a PN junction below) appears as a circle in the top-down perspective of FIG. 12. The parallel diode 74 illustrated as a symbol in FIG. 6 actually comprises many PN junctions, each having a separate circle-shaped diode contact. PN junction 84 of FIG. 13 is one of these many PN junctions. These many PN junctions are distributed across the integrated circuit. This structure involving many PN junctions distributed across the integrated circuit is referred to as a distributed diode structure. The distributed diode structure provides better heat balancing as compared to a structure where the parallel diode is realized as a single non-distributed junction that is located in only one localized part of the integrated circuit.

Figure 14:
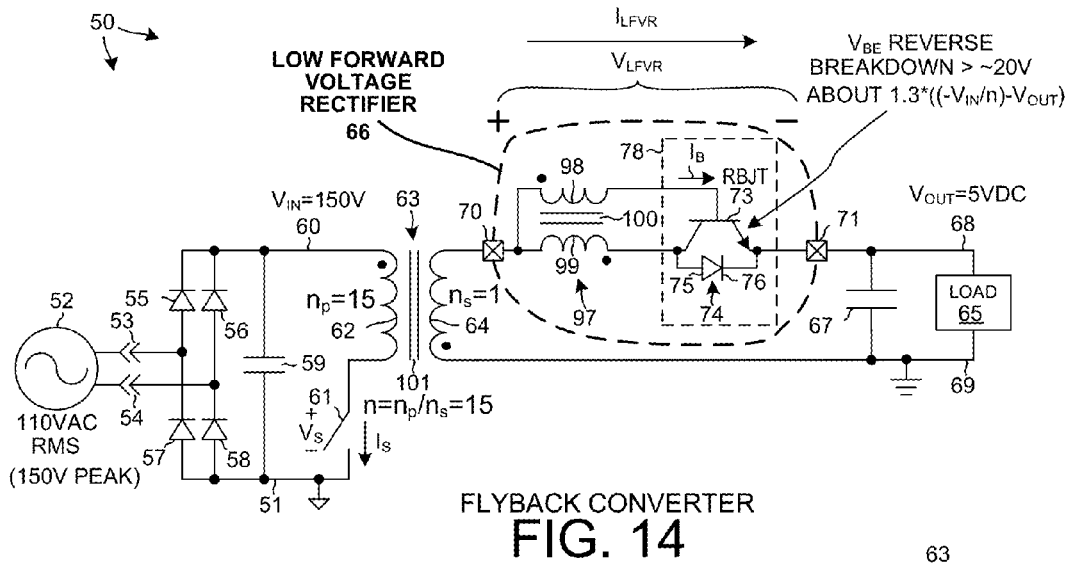
FIG. 14 is a diagram of the fly-back converter of FIG. 6, but with a specific implementation of the LFVR.

FIG. 14 is a diagram of the fly-back converter 50 of FIG. 6 but with a specific implementation of LFVR 66 shown. The implementation of LFVR 66 of FIG. 14 involves a current transformer 97 and the integrated circuit 78. Current transformer 97 includes a first winding 98, a second winding 99, and a ferrite core 100. The number of turns of the first winding 98 is at least twice as large (for example, three times as large) as the number of turns of the second winding 99. As indicated by the dots on the ends of the winding symbols in FIG. 14, the first and second windings 98 and 99 are wound with respect to one another such that an increase in current in the second winding results in an increase in current in the first winding.

In the example of FIG. 14, the only electrical circuit component in the path of the collector current is an inductive element (the second winding of current transformer 97). There is no resistive or diode or voltage drop current sense element disposed in the collector current path between the first package terminal 70 and the collector of RBJT 73. There is no semiconductor material disposed in the collector current path. Similarly, there is no resistive or diode or voltage drop current sense element disposed in the current path between the emitter of RBJT 73 and the second package terminal 71. There is no semiconductor material disposed in the emitter current path.

Figure 15:
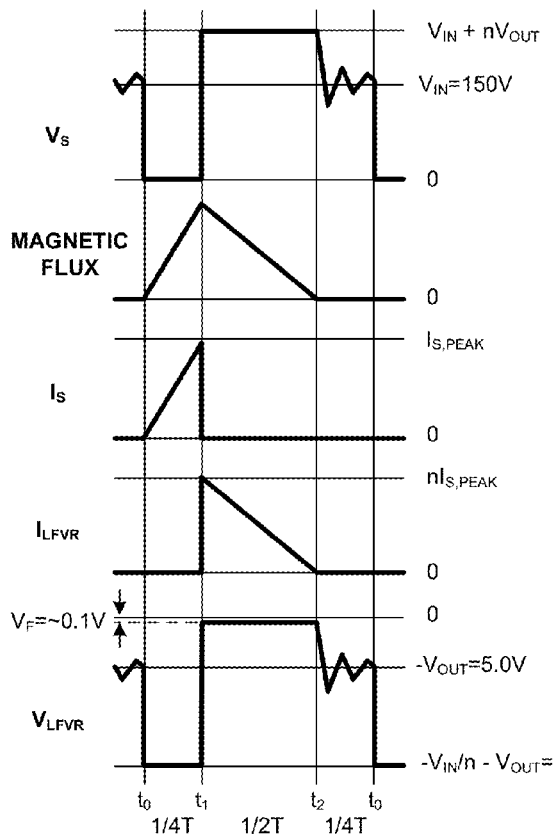
FIG. 15 is a set of waveform diagrams that shows voltages and currents in the fly-back converter of FIG. 14.

FIG. 15 is a set of waveform diagrams that shows voltages and currents in the fly-back converter 50 of FIG. 14. Switch 61 is closed from time $t_0$ to time $t_1$, and is open from time $t_2$ to time $t_2$ and then to time $t_0$ of the next switching cycle. When the switch 61 is closed energy is being stored in the transformer 63, and when the switch 61 is open the energy is transferred from the transformer 63 to capacitor 67 and load 65. When the switch 61 is open and current is flowing through the secondary winding 64, the forward voltage across LFVR 66 is about 0.1 volts for most of the time from time $t_2$ to time $t_2$.

Figure 16:
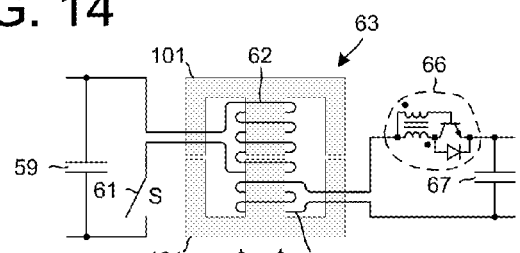
FIG. 16 illustrates current flow in the circuit of FIG. 14 from time $t_2$ to time $t_0$.
Figure 17:
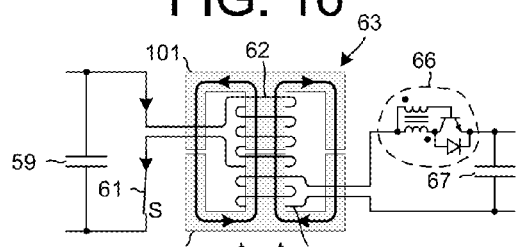
FIG. 17 illustrates current flow in the circuit of FIG. 14 from time $t_0$ to time $t_1$.
Figure 18:
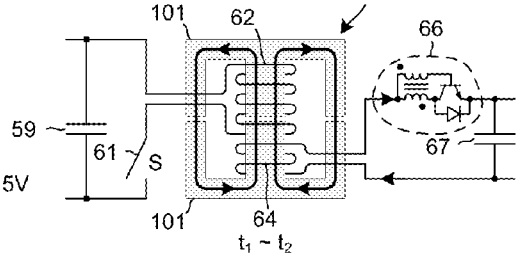
FIG. 18 illustrates current flow in the circuit of FIG. 14 from time $t_1$ to time $t_2$.

FIG. 16 illustrates current flow from time $t_2$ to time $t_0$. Reference numeral 101 identifies the split core of transformer 63. FIG. 17 illustrates current flow from time $t_0$ to time $t_1$. FIG. 18 illustrates current flow from time $t_2$ to time $t_2$.

FIG. 19 is a simplified cross-sectional diagram of a conventional bipolar junction transistor (BJT) structure. The low doped region 200 is the biggest source of conduction loss. The major charge carriers in the low doped region 200 are electrons from the emitter 201. Holes from the base 202 can enter the low doped region 200, but because the emitter voltage is lower than the voltage of the collector 203, the holes move toward the emitter 201. Because the supply of holes in the low doped region is weak and because charge neutrality must be maintained, it is difficult for the density of charge carriers in the low doped region 200 to be much higher than the doping concentration of the low doped region. Accordingly, the low doped region has a relatively high resistance. The relatively high resistance increases energy loss when the conventional BJT is conducting current at its rated current.

FIG. 20 is a simplified cross-sectional diagram of RBJT 73. The low doped region 89 has more charge carriers than the low doped region 200 in the conventional BJT structure of FIG. 19. There are both holes and electrons in low doped region 89. Holes enter the low doped region from the base 82, and electrons enter the low doped region from the emitter 91. Because the charges of these charge carriers are opposite one another, the charges cancel each other and net charge neutrality in low doped region 89 is maintained. Charge carrier density in the low doped region 89 is substantially higher than the doping concentration of the low doped region. Accordingly, the low doped region has a relatively low resistance and this relatively low resistance helps keep energy loss low when the RBJT is conducting current at its rated current.

Figure 21:
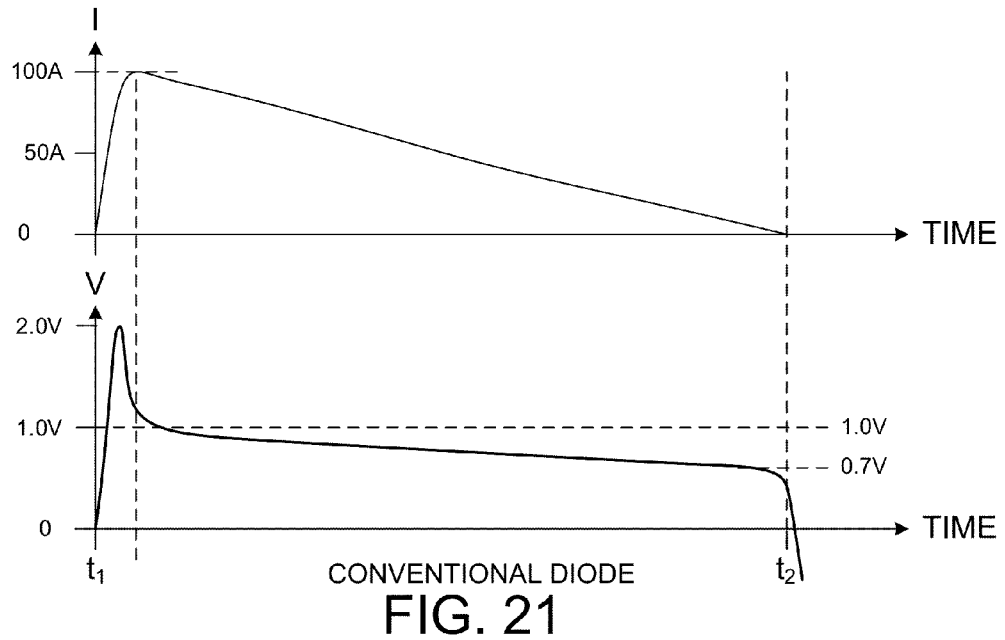
FIG. 21 is a waveform diagram showing the voltage drop across and current flow through a conventional diode if the conventional diode is used for the rectifying component in a flyback converter.

FIG. 21 is a waveform diagram for a conventional diode operating as the rectifier component in a flyback converter from time $t_1$ to time $t_2$. The time from time $t_1$ to time $t_2$ is the time when current flows through the secondary winding of the transformer and through the rectifying component. After an initial transient period, the voltage drop across the forward biased diode decreases from about 1.0 volts to about 0.7 volts at the end of the time period.

Figure 22:
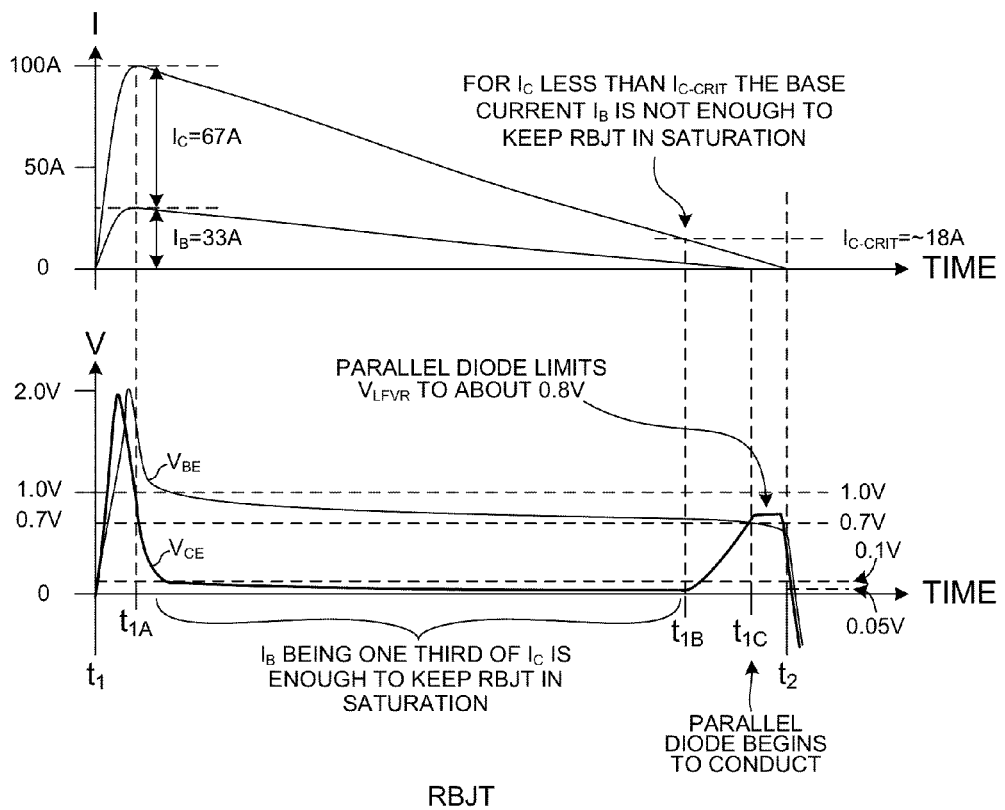
FIG. 22 is a waveform diagram showing the voltage drop across and current flow through the LFVR of FIG. 14 between time $t_1$ and time $t_2$.

FIG. 22 is a waveform diagram for RBJT 73 of LFVR 66 of FIG. 14. After an initial transient period from $t_1$ to time $t_{1A}$, the $V_{CE}$ voltage drop across RBJT 73 decreases from about 0.1 volts to about 0.05 volts. During this time from $t_{1A}$ to time $t_{1B}$, the collector current $I_C$ and the base current $I_B$ decrease as illustrated in the upper waveform. At some point, the collector current reaches a critical current $I_{C\text{-}CRIT}$ at which the base current $I_B$ is not adequate to keep the RBJT in saturation. This is indicated to occur at time $t_{1B}$ in FIG. 22. At this time, $V_{CE}$ begins increasing. At time $t_{1C}$ the forward bias across diode 74 is large enough that diode 74 begins conducting appreciable current. Diode 74 limits the voltage $V_{LFVR}$ to about 0.8 volts. At time $t_2$ current flow through the secondary winding 64 stops, so current flow through LFVR 66 stops as well.

Figure 1:
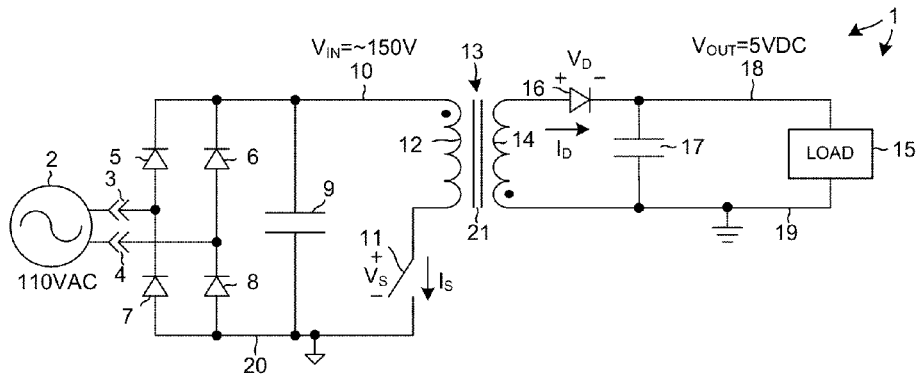
FIG. 1 (Prior Art) is a diagram of a conventional flyback converter power supply.
Figure 2:
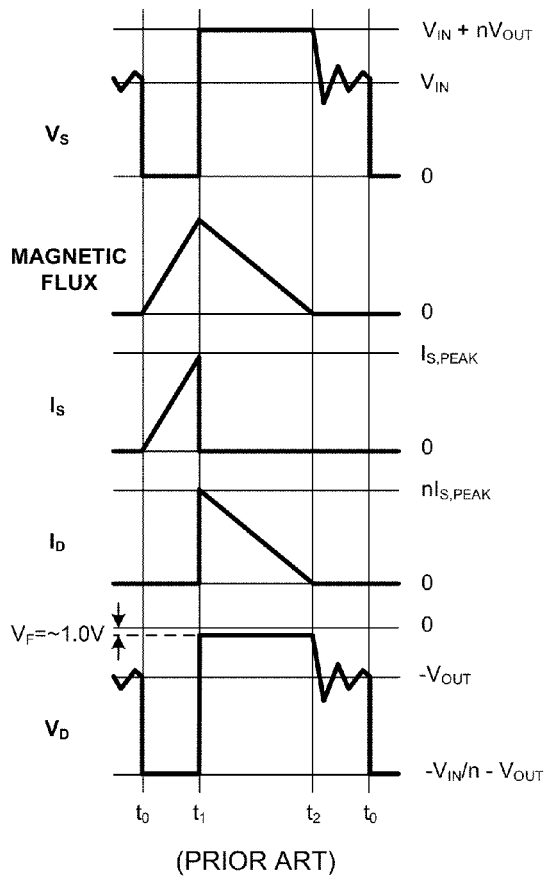
FIG. 2 (Prior Art) is a waveform diagram showing voltages and currents in the circuit of FIG. 1.
Figure 3:
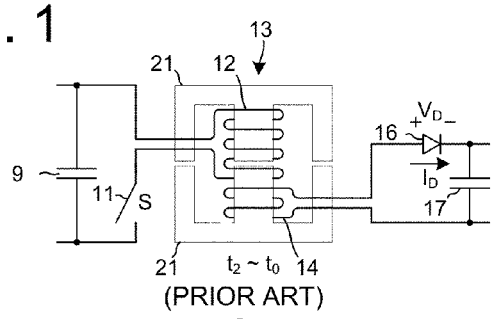
FIG. 3 (Prior Art) illustrates current flow in the conventional flyback converter of FIG. 1 from time $t_2$ to time $t_0$.
Figure 4:
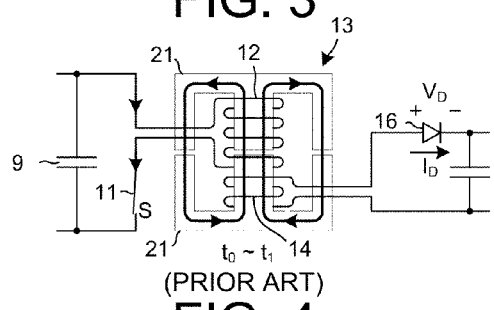
FIG. 4 (Prior Art) illustrates current flow in the conventional flyback converter of FIG. 1 from time $t_0$ to time $t_1$.
Figure 5:
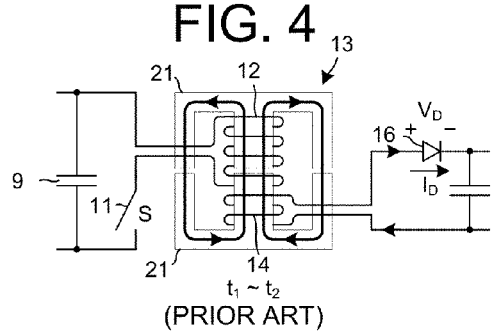
FIG. 5 (Prior Art) illustrates current flow in the conventional flyback converter of FIG. 1 from time $t_2$ to time $t_2$.
Figures 23, 24:
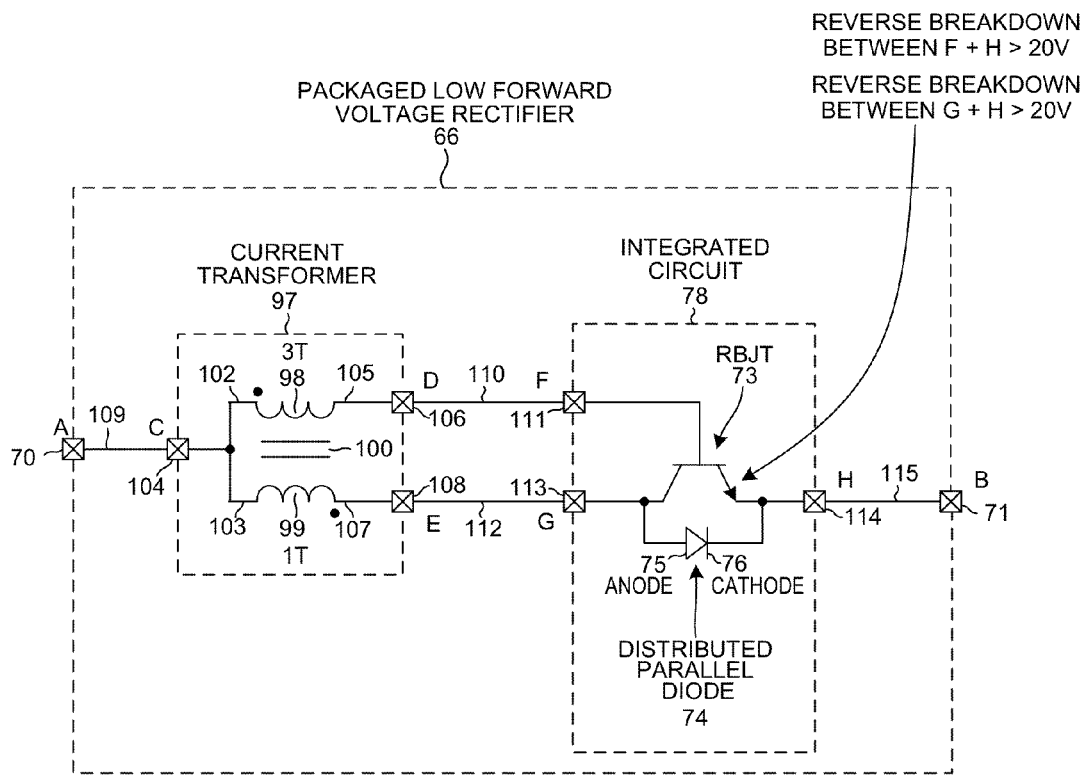
FIG. 23 is a table that compares the average power dissipation of the conventional flyback converter circuit of FIG. 1 involving a conventional silicon diode as the rectifying component to the average power dissipation of the novel flyback converter circuit of FIG. 6 involving an LFVR as the rectifying component.
FIG. 24 is a detailed diagram of a particular implementation of the LFVR of FIG. 14.

FIG. 23 is a table that compares the average power dissipation of the conventional flyback converter circuit of FIG. 1 (20 amperes out at 5.0 volts DC) involving a conventional silicon diode as the rectifying component to the average power dissipation of the novel flyback converter circuit of FIG. 6 (20 amperes out at 5.0 volts DC) involving LFVR 66 as the rectifying component. Other than the type of rectifying component, the circuit topologies of the circuits of FIG. 1 and FIG. 6 are identical.

FIG. 24 is a more detailed diagram of a particular implementation of the LFVR 66 of FIG. 14. A first end 102 of first winding 98 and a first end 103 of second winding 99 are coupled together and to a transformer terminal 104. A second end 105 of first winding 98 is coupled to a transformer terminal 106. A second end 107 of second winding 99 is coupled to a transformer terminal 108. The first winding 98 has three turns. The second winding 99 has one turn. The terminal 104 of the transformer is coupled via bond wire 109 to the first package terminal 70 of LFVR 66. The terminal 106 of the transformer is coupled via bond wire 110 to a base terminal 111 of integrated circuit 78. The terminal 108 of the transformer is coupled via bond wire 112 to a collector terminal 113 of integrated circuit 78. An emitter terminal 114 (emitter metal electrode 93) of integrated circuit 78 is coupled via conductive heat sink 115 to second package terminal 71. The conductive heat sink 115 is a portion of the metal leadframe of the package. The second package terminal 71 is a pin-shaped extension of the heat sink. Both the pin-shaped second package terminal 71 and the conductive heat sink 115 are stamped from the same piece of leadframe metal. In the diagram, A identifies first package terminal 70: B identifies second package terminal 71; C, D and E identify the three terminals of current transformer 97; F, G and H identify the three terminals of integrated circuit 78. In the illustrated example, LFVR 66 has no package terminal other than the two package terminals 70 and 71.

Figure 25:
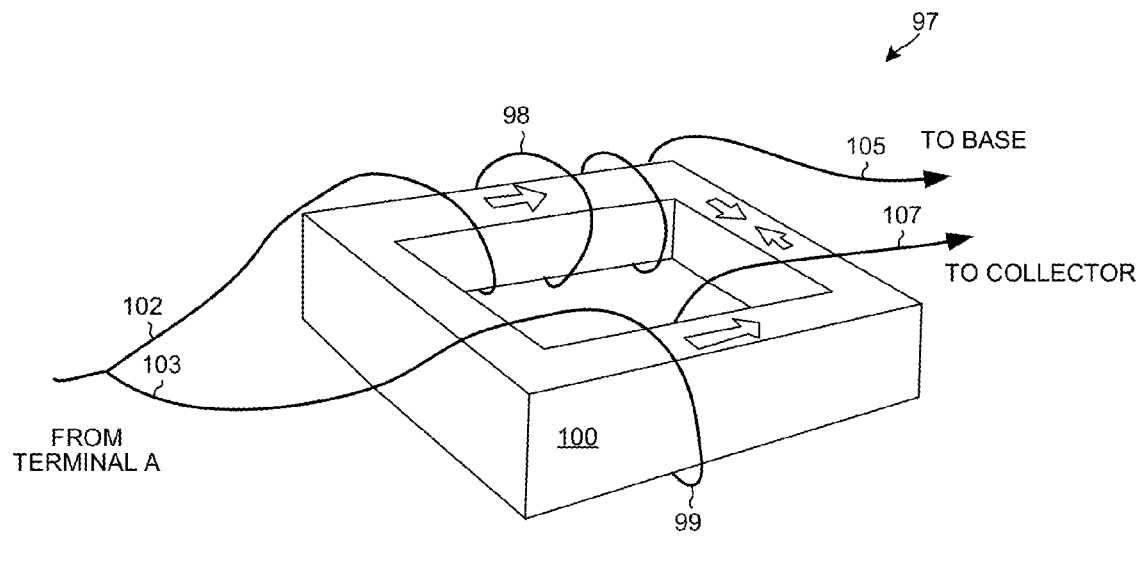
FIG. 25 is a simplified perspective conceptual diagram of the current transformer of the LFVR of FIG. 14.

FIG. 25 is a simplified perspective conceptual diagram of current transformer 97.

Figure 26:
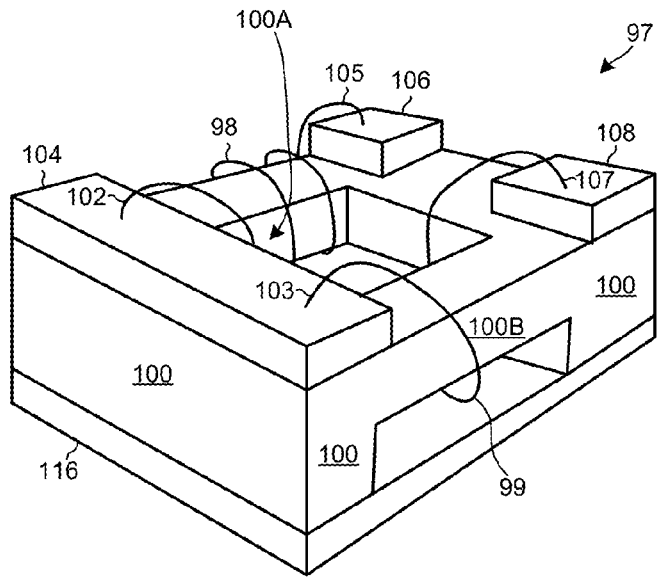
FIG. 26 is a more detailed perspective diagram of the current transformer of the LFVR of FIG. 14.

FIG. 26 is a more detailed perspective diagram of current transformer 100. An insulative spacer 116 attaches to the bottom of the ring-shaped core 100 as illustrated. The ring-shaped core 100 has bridging portions 100A and 100B that allow turns of wire to loop under and around the core between the bottom of the bridge portions and the top of the spacer 116. In one example, insulative spacer 116 is a preformed injection molded plastic part. In another example, insulative spacer 116 is heat conductive ceramic. In another example, insulative spacer 116 is a piece of two-sided insulative tape.

Figure 27:
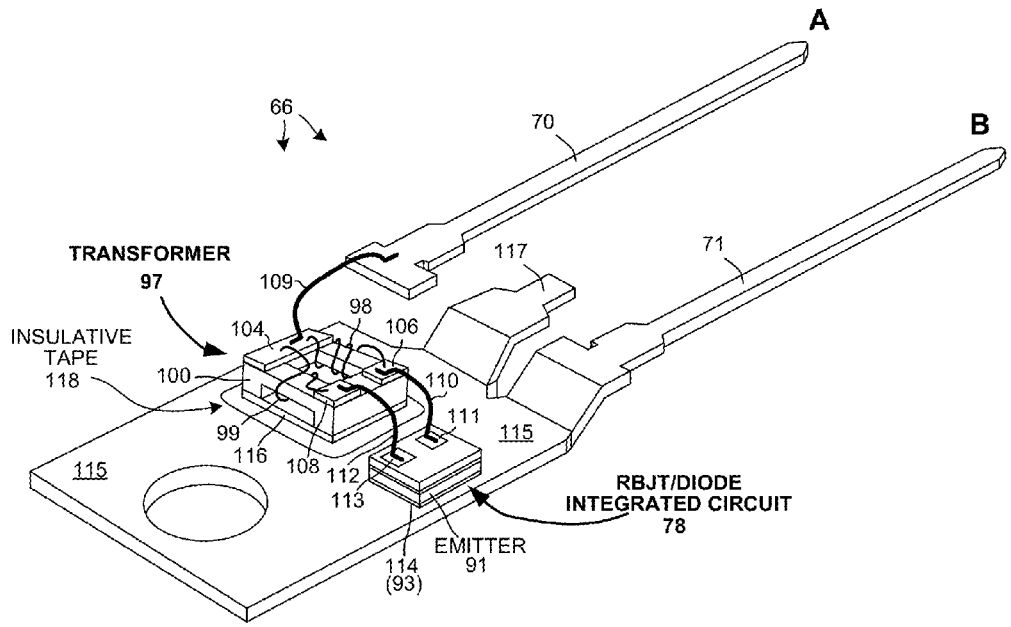
FIG. 27 is a simplified perspective view of the packaged LFVR of FIG. 14 before encapsulation.

FIG. 27 is a simplified perspective view of the packaged Low Forward Voltage Rectifier (LFVR) 66 before encapsulation. The extension 117 of the stamped and formed copper leadframe is cut off. A piece of insulative tape 118 is disposed underneath the transformer 97 between the transformer 97 and conductive heat sink 115. In this case the insulative tape 118 is optional due to insulative spacer 116 being present.

Figure 28:
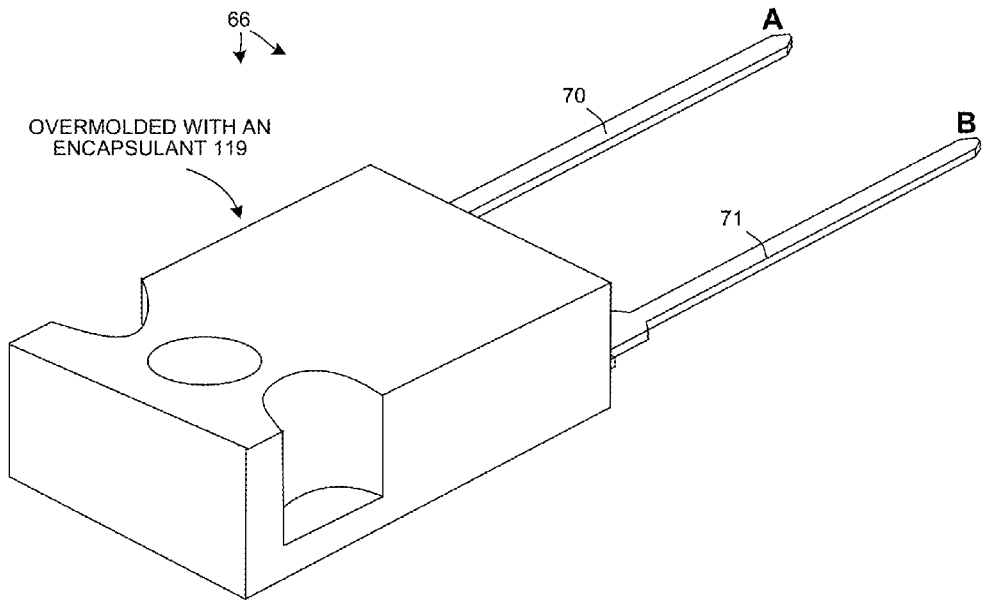
FIG. 28 is a simplified perspective view of the packaged LFVR of FIG. 14 after encapsulation.

FIG. 28 is a perspective view of the packaged LFVR 66 after the assembly has been overmolded with an injection molded plastic encapsulant 119. The packaged LFVR 66 conforms to the form factor of a standard large form factor through hole TO-247 package except that the middle terminal of the standard TO-247 package is not present. The package includes the two package terminals 70 and 71, the conductive heat sink 115, and the encapsulant 119.

Figure 29:
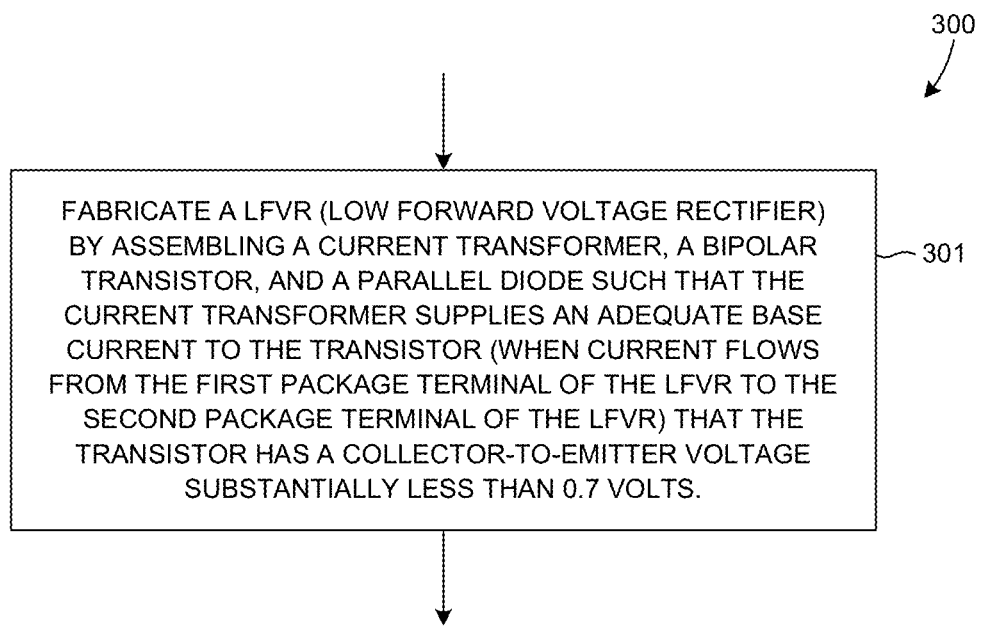
FIG. 29 is a simplified flowchart of a method 300 in accordance with one novel aspect.

FIG. 29 is a flowchart of a method 300 of manufacturing a packaged electronic device. A LFVR (Low Forward Voltage Rectifier) is fabricated (step 301) by assembling a current transformer, a bipolar transistor, and a parallel diode such that the current transformer supplies an adequate base current to the transistor (for example, $I_B=I_C/3$) when current flows (under forward bias conditions) from the first package terminal of the LFVR to the second package terminal of the LFVR, thereby causing the transistor to have a collector-to-emitter voltage substantially less than 0.7 volts. In one example, the assembled LFVR is the LFVR 66 illustrated in FIGS. 24, 27 and 28. The bipolar transistor is RBJT 73. The parallel diode is distributed diode 74. The RBJT and the distributed diode of the assembly are parts of the same integrated circuit 78. The first package terminal is package terminal 70. The second package terminal is package terminal 71. Assembly involves surface mounting the current transformer and the integrated circuit to the heat sink portion of the leadframe, and then wire bonding the components together as illustrated in FIG. 27, and then overmolding the components to realize the finished packaged electronic device illustrated in FIG. 28.

FIG. 29 is a simplified flowchart of a method 300 in accordance with one novel aspect. A LFVR is fabricated (step 301) by assembling a current transformer, a bipolar transistor, and a parallel diode such that the current transformer supplies an adequate base current to the transistor (when a current greater than $I_{C\text{-}CRIT}$ flows from the first package terminal of the LFVR to the second package terminal of the LFVR) that the transistor has a collector-to-emitter voltage substantially less than 0.7 volts (for example, 0.1 volts).

Although certain specific embodiments are described above for instructional purposes, the teachings of this patent document have general applicability and are not limited to the specific embodiments described above. Although the LFVR is described above in an application involving a specific flyback converter power supply, the LFVR is of general applicability in other circuits including other power supply circuit topologies. Although an example is set forth above where the base current injection circuit is implemented using a current transformer, the base current injection circuit can be implemented in other ways. Accordingly, various modifications, adaptations, and combinations of various features of the described embodiments can be practiced without departing from the scope of the invention as set forth in the claims.

What is claimed is:

1. An electronic device comprising:
   a current transformer having a first winding and a second winding, the first winding having a first end and a second end, the second winding having a first end and a second end;
   a bipolar transistor having a first terminal, a second terminal, and a third terminal, wherein the first terminal is a collector terminal, wherein the second terminal is a base terminal, wherein the third terminal is an emitter terminal, wherein the second end of the first winding of the current transformer is coupled to the second terminal of the bipolar transistor, and wherein the second end of the second winding of the current transformer is coupled to the first terminal of the bipolar transistor;
   a diode having an anode and a cathode, wherein the anode is coupled to the first terminal of the bipolar transistor, and wherein the cathode is coupled to the third terminal of the bipolar transistor; and
   a package having a first package terminal and a second package terminal, wherein the first package terminal is coupled to the first end of the first winding of the current transformer, wherein the first package terminal is coupled to the first end of the second winding of the current transformer, wherein the second package terminal is coupled to the third terminal of the bipolar transistor, and wherein the package encapsulates the current transformer, the bipolar transistor, and the diode.

2. The electronic device of claim 1, wherein the bipolar transistor and the diode are parts of an integrated circuit.

3. The electronic device of claim 2, wherein the diode is a distributed diode and comprises a plurality of distributed PN junctions.

4. The electronic device of claim 1, wherein the first winding has a first number of turns, wherein the second winding has a second number of turns, and wherein the first number is at least twice as large as the second number.

5. The electronic device of claim 4, wherein an increase in a first current flow from the first package terminal through the second winding to the first terminal of the bipolar transistor results in an increase in a second current flow from the first package terminal through the first winding to the second terminal of the bipolar transistor.

6. The electronic device of claim 1, wherein the bipolar transistor has a reverse breakdown voltage between the third terminal of the bipolar transistor to the second terminal of the bipolar transistor, and wherein the reverse breakdown voltage is at least twenty volts.

7. The electronic device of claim 1, wherein the first and second windings are wrapped around a ring-shaped core.

8. The electronic device of claim 1, wherein the package has no package terminal other than the first package terminal and the second package terminal.

9. The electronic device of claim 1, wherein the bipolar transistor and the diode are parts of an integrated circuit, wherein the diode is a distributed diode and comprises a plurality of PN junctions, wherein the bipolar transistor includes a lightly doped layer, wherein a base region of the bipolar transistor and a collector region of the bipolar transistor are disposed on an opposite side of the lightly doped layer from an emitter region of the bipolar transistor.

10. The electronic device of claim 9, wherein the bipolar transistor comprises a base metal electrode that adjoins the base region, wherein the bipolar transistor comprises a collector metal electrode that adjoins the collector region, and wherein the collector metal electrode bridges over the base metal electrode.

11. The electronic device of claim 10, wherein the current transformer has a ferrite core.

12. The electronic device of claim 1, wherein there is no resistive current sense element disposed in a collector current path between the first package terminal and the first terminal of the bipolar transistor, and wherein there is no semiconductor material disposed in a collector current path between the first package terminal and the first terminal of the bipolar transistor.

13. The electronic device of claim 1, wherein there is no diode whose anode is directly connected to the emitter terminal of the bipolar transistor and whose cathode is directly connected to the base terminal of the bipolar transistor.

* * * * *